United States Patent
Poplevine et al.

[11] Patent Number: 5,982,676
[45] Date of Patent: Nov. 9, 1999

[54] LOW VOLTAGE GENERATOR FOR BITLINES

[75] Inventors: Pavel Poplevine, Foster City; Alexander Kalnitsky, San Francisco, both of Calif.

[73] Assignee: STMicroelectronics, Inc., Carrollton, Tex.

[21] Appl. No.: 09/085,559

[22] Filed: May 26, 1998

[51] Int. Cl.[6] .............................. G11C 16/04; G11C 7/00
[52] U.S. Cl. .............................. 365/189.06; 365/189.09; 365/189.11
[58] Field of Search .......................... 365/189.06, 189.09, 365/189.11, 189.05, 207, 208; 326/81

[56] References Cited

U.S. PATENT DOCUMENTS

| | | | |
|---|---|---|---|
| 4,788,663 | 11/1988 | Tanaka et al. | 365/185.1 |
| 5,117,131 | 5/1992 | Ochi et al. | 326/81 |
| 5,132,936 | 7/1992 | Keswick et al. | 365/189.06 |
| 5,200,921 | 4/1993 | Okajima | 365/189.11 |
| 5,206,942 | 4/1993 | Ibi | 365/189.05 |
| 5,253,205 | 10/1993 | Eaton, Jr. | 365/189.09 |
| 5,444,659 | 8/1995 | Yokokura | 365/189.09 |
| 5,777,939 | 7/1998 | Won | 365/189.09 |

*Primary Examiner*—Trong Phan
*Attorney, Agent, or Firm*—Theodore E. Galanthay; Lisa K. Jorgenson; Jeffrey K. Weaver

[57] ABSTRACT

Disclosed is an electrical technique for clamping the bitline voltage above zero volts in a DRAM circuit. The technique may be used in embedded DRAM arrays implemented in logic-based technology employing low threshold voltages. The invention employs a low voltage generator to provide a bitline voltage slightly above zero volts. Applying this slightly elevated level to the input of a DRAM cell access transistor effectively increases the threshold voltage of that transistor and thus limits sub-threshold leakage current. The low voltage generator may be implemented as a cascode circuit with supplemental current sources.

22 Claims, 4 Drawing Sheets

LOW VOLTAGE GENERATOR FOR BITLINES

BACKGROUND OF THE INVENTION

The present invention relates to electrical techniques for controlling the threshold voltage of access transistors in DRAM cells. More particularly, the invention relates to low voltage generators for applying a low voltage to a memory array bitline.

Many types of integrated circuit designs now commonly contain memory arrays embedded within logic-based chips. Such designs improve performance by providing on-chip memory, thereby reducing the number of input-output (I/O) operations between the processor and a general purpose RAM. Embedded memory is becoming particularly important in custom integrated circuits such as application specific integrated circuits (ASICs) and programmable logic devices (PLDs). It is also used for many specialized applications such as printer and graphics integrated circuits.

Embedded memory often takes the form of DRAM arrays. Each DRAM cell includes an access transistor and a storage capacitor. To prevent unacceptable levels of charge leakage through the access transistor, that transistor's threshold voltage is purposely set high. If the threshold voltage is set too low, the access transistor will leak too much current and possibly lose data. To address this issue, most dedicated DRAM chips employ a process technology such as a high Vt channel implant which raises the threshold voltage to a level that holds back significant leakage.

For performance reasons, most logic-based integrated circuits are designed with transistors that operate at lower threshold voltages than DRAM access transistors. If an embedded memory integrated circuit is fabricated with a process suitable for logic circuits (low threshold voltage), DRAM leakage may be unacceptable. If the integrated circuit is fabricated with a process suitable for DRAMs (high threshold voltage), performance may suffer. A fabrication process could be designed such that MOS transistors in the logic and memory sections of the integrated circuit are processed differently (to impart different threshold voltages). However, this introduces additional process steps which increases the manufacturing cost.

For these reasons, improved techniques for controlling the threshold voltage DRAM cells in embedded memory applications would be desirable.

SUMMARY OF THE INVENTION

The present invention provides an electrical technique for clamping the bitline voltage above zero volts in a DRAM circuit. The technique finds important application in embedded DRAM arrays implemented in logic-based technology employing low threshold voltages—although it could be used in any system where it is desirable to raise access transistor threshold voltage. The invention employs a low voltage generator to provide a bitline voltage slightly above zero volts. Applying this slightly elevated level to the input of a DRAM cell access transistor effectively increases the threshold voltage of that transistor and thus limits sub-threshold leakage current. The low voltage generator may be implemented in many ways.

One aspect of the invention provides a memory system (e.g., an integrated circuit having embedded memory) for clamping a bitline voltage above zero volts. This system may be characterized as including the following elements: (1) a memory array including a bitline; (2) a sense amplifier coupled to the bitline; and (3) a cascode circuit having an output coupled to the sense amplifier, such that the output controls the potential of the bitline. The system may also include one or more pass transistors interposed between the bitline and the cascode circuit output. Preferably, the cascode circuit is implemented in MOS transistors and the memory array is a DRAM array.

In a specific embodiment, the cascode circuit includes a first transistor and a second transistor connected in series between Vdd and ground, with the first transistor being located between ground and the second transistor. The cascode has an output located between the first and second transistors. This circuit also includes a first current source coupled in series between Vdd and the second transistor. It may also include a second current source connected to a first node located between said second transistor and the current source. This second current source provides current as a function of the difference between a reference voltage and the voltage at the first node. The reference voltage may be a function of the resistance of a temperature sensitive resistor. This serves to maintain a relatively high potential at the first node as temperature increases and thereby causes more leakage through the first transistor. Finally, the circuit may also include a third current source connected to a gate of the second transistor. This third current source provides current as a function of the voltage at the first node. This may be employed to maintain relatively high voltages on the bitline and the first node when current through the output node is abruptly shut off, making the circuit susceptible to undershoot. In a preferred embodiment, the third current source includes a current mirror.

The invention also provides low voltage generators employing at least one of the second and third current sources as described above. These and other features and advantages of the invention will be described below in the Detailed Description section with reference to the appended drawings.

DETAILED DESCRIPTION OF THE PREFERRED EMBODIMENTS

The invention will be described with reference to certain preferred embodiments set forth below. Specifically, the invention will be described with reference to particular circuitry that includes three specific current generators. It should be understood that the invention is in no way specifically limited to this embodiment.

Figure 1:
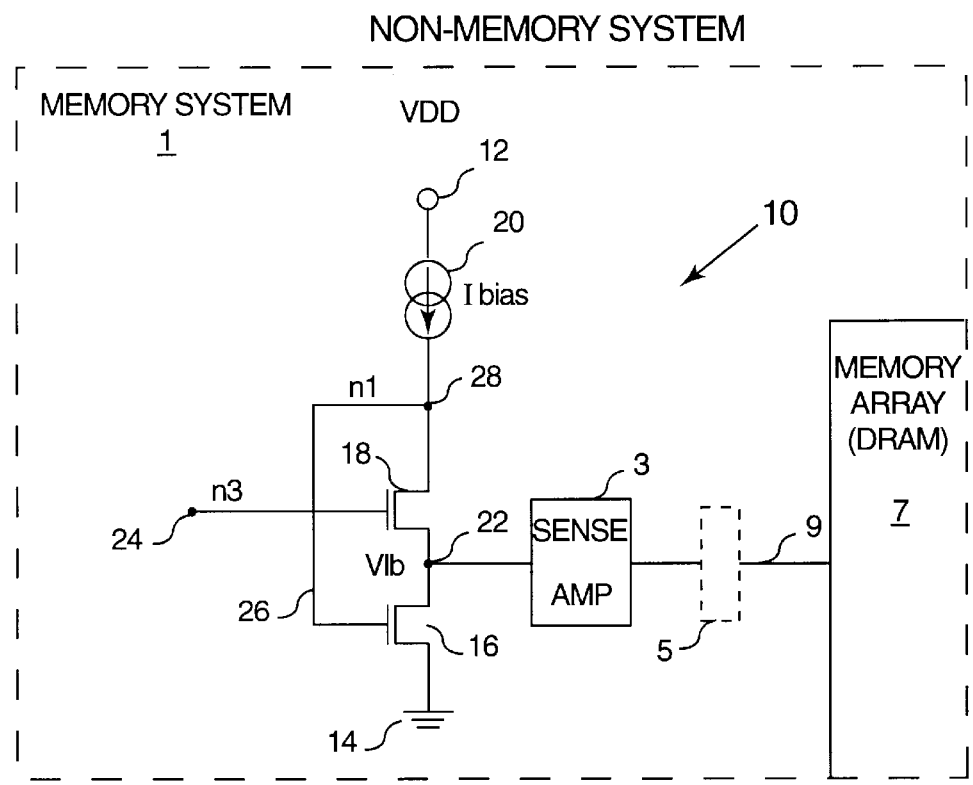
FIG. 1 presents a schematic illustration of an NMOS cascode circuit that may be employed to generate a controlled voltage on a bitline.

FIG. 1 presents a preferred embodiment of the present invention. In this embodiment, (memory system 1) an NMOS cascode circuit serves as a low voltage generator whose output voltage, Vlb, is used to clamp a bitline voltage above 0 V in a DRAM circuit. This level applied to the input of DRAM access transistors effectively increases the threshold voltage of the transistor and thus limits the sub-threshold leakage current. While other circuitry could be employed to clamp the bitline 9 at such potentials, the cascode circuit shown in FIG. 1 will be used to illustrate some of the principles of this invention.

As shown in FIG. 1, a cascode circuit 10 includes a contact 12 held at Vdd and a contact 14 held at ground. Coupled to ground contact 14 through its source is an NMOS transistor 16. The drain of NMOS transistor 16 is coupled to the source of another NMOS transistor 18. In turn, NMOS transistor 18 is coupled to a current source 20 through its drain. Current source 20 is interposed between Vdd contact 12 and NMOS transistor 18. It provides a bias current (Ibias) to NMOS transistors 16 and 18.

The output of cascode circuit 10 is provided at the series connection of NMOS transistors 16 and 18 at a node 22. The potential at node 22 is Vlb. The cascode circuit is designed so that Vlb is held at a potential above 0 V and can be applied to the bitline of an associated memory array 7 (e.g. 9 DRAM array). Interposed between the DRAM array and node 22 may be a sense amplifier 3 and associated pass gates 5.

In cascode circuit 10, the gate of NMOS transistor 18 is controlled by a node 24 (also referenced as n3 herein) having a reference voltage. The gate electrode of NMOS transistor 16 is controlled by the potential on a line 26 which is coupled to a node 28 in cascode circuit 10. Specifically, node 28 (sometimes referred to herein as n1) is located between the drain of NMOS transistor 18 and current source 20. In this circuit, the output voltage, Vlb, is equal to the reference voltage on node 24 minus the threshold voltage of NMOS transistor 18, Vlb=Vn3–Vt (NMOS 18).

While this design can clamp the bitline to a voltage above 0 V under a wide range of circumstances, it can be modified to improve its characteristics in certain circumstances. For example, another current source may be added to improve the high temperature performance. Specifically, to ensure minimum power consumption of the cascode circuit in the static mode, the bias current, Ibias, should be maintained in the microAmpere regime. At elevated temperatures, the voltage at n1 may be reduced due to leakage through transistor 16. Note that NMOS transistor 16 should ensure a high current sinking capability; this may be achieved by designing the transistor with a high width to channel length ratio. The side effect of such designs is the generation of significant leakage current through the transistor at fairly low voltages on node 28 (line 26). Then, at elevated temperatures, the voltage at node 28 (n1) may be reduced due to leakage through NMOS transistor 16, as mentioned. This will in turn cause NMOS transistor 18 to operate in a linear region (unsaturated) and thereby cause the cascode operation to be lost.

Figure 2:
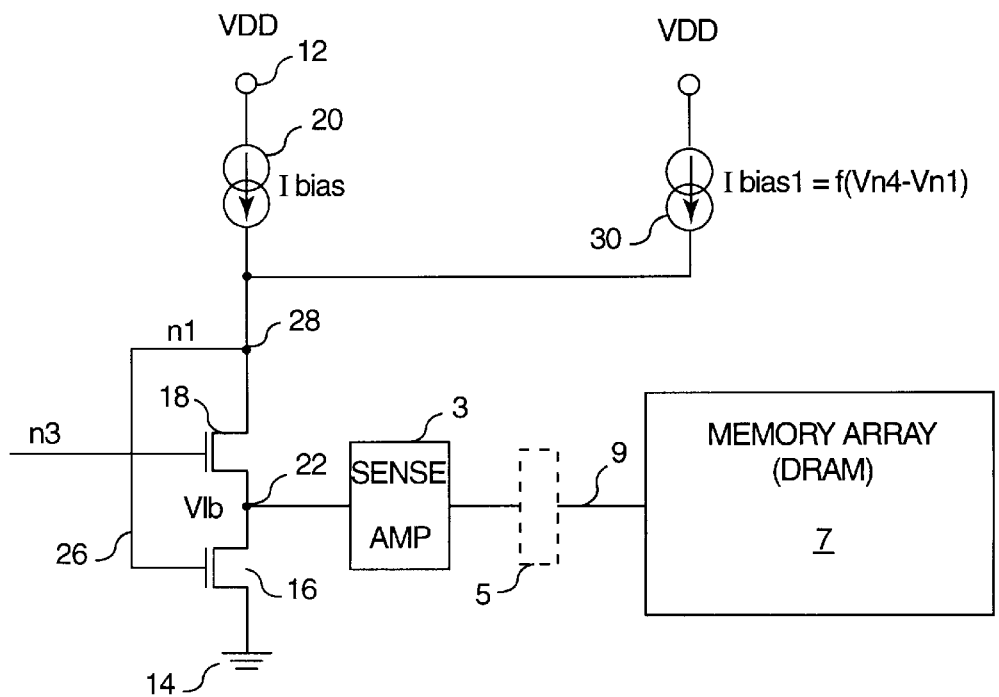
FIG. 2 presents a schematic illustration of the NMOS cascode circuit of FIG. 1 modified to include a current source for keeping a high voltage at the drain of an NMOS transistor in the cascode circuit when exposed to elevated temperatures.

To alleviate this potential problem, an additional current source 30 may be connected to node 28 (n1) as shown in FIG. 2. Current source 30 provides a current Ibias 1 that is a function of the difference between a second reference voltage, Vn4, and the voltage at node 28; Ibias 1=f(Vn4–Vn1). Preferably, current source 30 is designed so that when the voltage at node 28 drops (as can happen at elevated temperatures) it will provide additional current to that node, compensating for the leakage current through NMOS transistor 16. This will prevent NMOS transistor 18 from operating in the linear region and causing the circuit to loose its cascode function.

Another situation which could possibly cause problems in operation of cascode circuit 10 is the abrupt switching off of current to the bitline. That is, if current flow into the Vlb terminal (node 22) is high, the potential at node 28 increases. When this current is abruptly switched off, the NMOS transistor 16 discharges the Vlb node (node 22) below the desired level, causing undershoot. This undershoot is experienced on the bitline which may cause the pass gates to become leaky.

Figure 3:
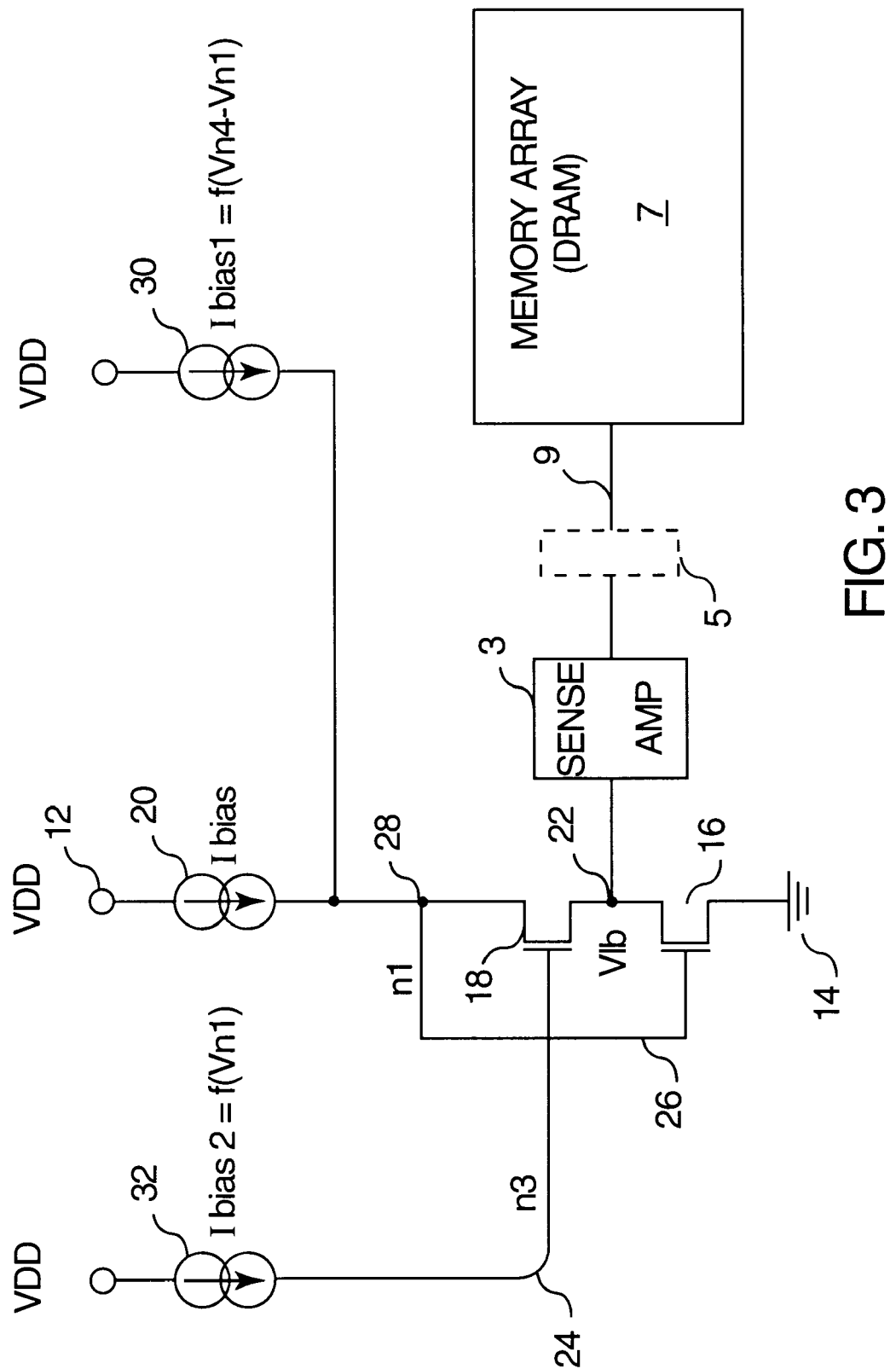
FIG. 3 presents a schematic illustration of the NMOS cascode circuit of FIG. 2 modified to include a current source for controlling undershoot that can occur when current to the bitline is switched off.

This potential problem may be alleviated by providing a third current source 32 as shown in FIG. 3. Current source 32 provides a current, Ibias 2, as a function of the voltage at node 28 (n1); Ibias 2=f(Vn1). This current affects the gate potential of NMOS transistor 18. Preferably, current source 32 is designed to increase the reference voltage at node 24 (Vn3) by deltaV during the transient undershoot, described above. With the proper choice of deltaV, the output level, Vlb, can be prevented from going below a desired minimum value.

Current source 32 may be designed to work as follows. When a high current flows into Vlb, the voltage at node 28 (Vn1) increases, thereby causing an increase in the Vn3 level. When the current into Vlb is switched off, the undershoot is shifted by deltaV, which can be chosen to compensate for the expected undershoot magnitude.

Figure 4:
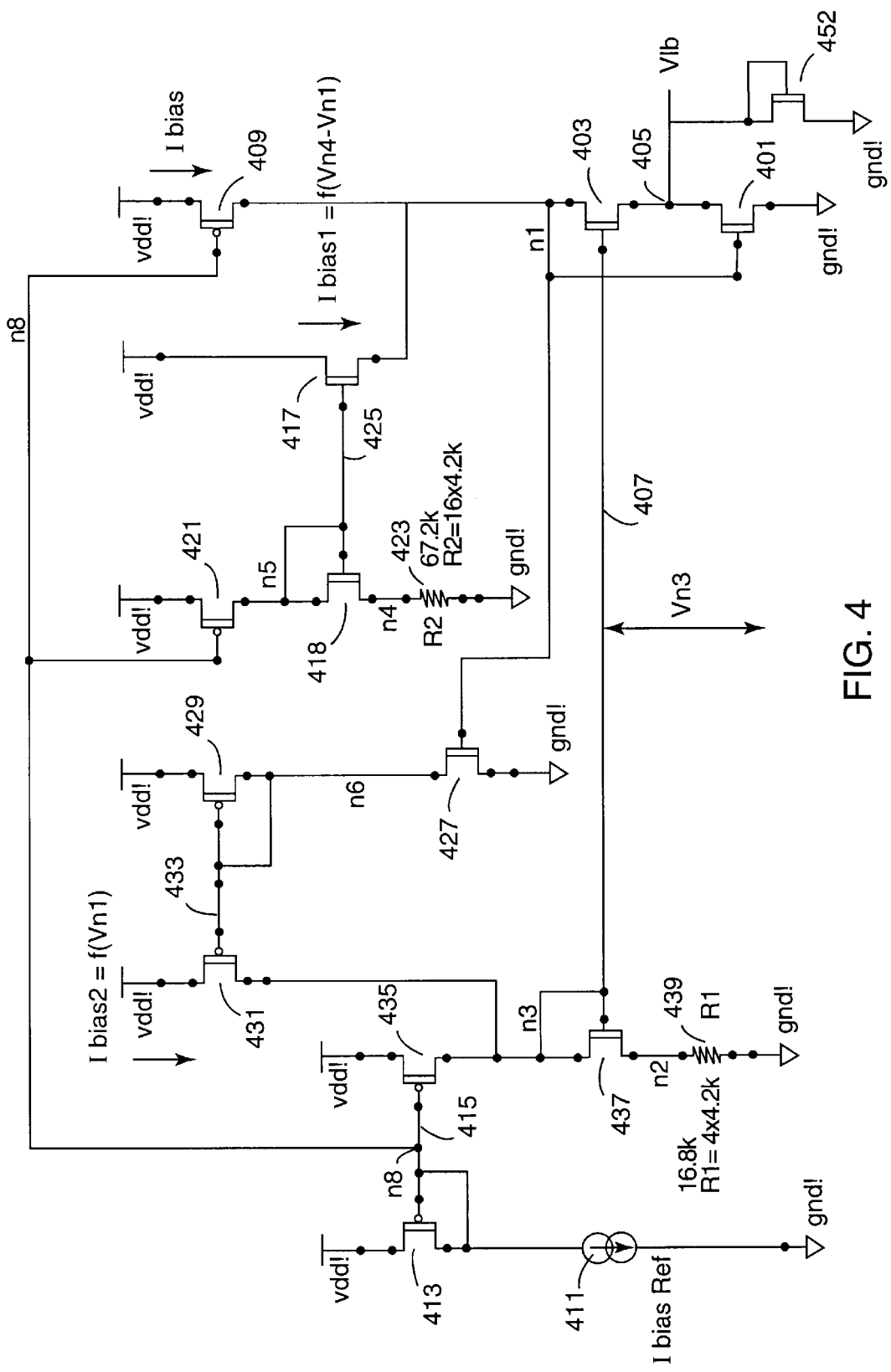
FIG. 4 presents a detailed schematic illustration of one implementation of the cascode circuit of FIG. 3.

FIG. 4 presents one implementation of the cascode Vlb generator shown in FIG. 3. Consistent with some goals of this invention, the schematic shown in FIG. 4 maintains the Vlb output voltage at a constant level, independent of the output current required by the load.

As shown in a schematic of FIG. 4, the cascode circuitry includes an NMOS transistor 401 connected in series with another NMOS transistor 403. Transistor 401 is connected to ground and transistor 403 is connected to Vdd through a current source. Between the current source and NMOS transistor 403 is a node n1. Node n1 is connected to the gate of NMOS transistor 401 and hence controls the current flow through that transistor. The Vlb output of the cascode circuitry is provided through a node 405 lying between the drain of NMOS transistor 401 and the source of NMOS transistor 403. The gate of NMOS transistor 403 is controlled by the potential on a line 407.

This arrangement is very similar to that shown in FIGS. 1–3. In the specific embodiment exemplified here, NMOS transistor 401 has a width of about 500 microns and a channel length of about 0.35 microns. This gives it the high current sinking capability described above. NMOS transistor 403 is also provided with a channel width of 500 microns, but its channel length is 0.4 microns.

The main current source, providing a current Ibias, is provided through a PMOS transistor 409, its source is connected to Vdd and its drain is connected to n1. The amount of current through transistor 409 is a function of the gate voltage on that transistor. Preferably, the gate voltage is kept rather constant. In this instance, the gate of PMOS transistor 409 is controlled through a node n8. The potential on node n8 is, in turn, controlled by another current source 411 (providing a current Ibias Ref) in conjunction with the constant current threshold of a PMOS transistor 413 connected in series with current source 411. Specifically, PMOS transistor 413 has a source connected to Vdd and a drain connected to current source 411. A line 415 connects the drain of PMOS transistor 413 to node n8 which is coupled to the gate of transistor 435.

In a specific embodiment, PMOS transistor 409 has a channel width of 7.5 microns and a channel length of 1 micron. In this embodiment, PMOS transistor 413 includes a channel width of 5 microns and a channel length of 1 micron. Current source 411 is preferably a low voltage source with very constant current. It sets the potential at node n8 to a value below Vdd, which normally holds the various current sources on in the FIG. 4 schematic.

One of these additional current sources is current source 30 shown in FIGS. 2 and 3. As indicated above, for low values of NMOS threshold voltage (e.g., at high temperatures), the node n1 voltage may be reduced due to leakage (in this case through transistor 401) which will prevent the circuitry from operating in cascode mode. To overcome this problem, an additional control circuit is provided in the schematic of FIG. 4. Specifically, a control circuit including NMOS transistors 417 and 418, a PMOS transistor 421, and a resistor 423 together provide a current Ibias1 to node n1. Consistent with the embodiments described above, Ibias1 is a function of the difference between the voltage on a node n4 and the voltage on node n1.

In a specific embodiment shown in FIG. 4, NMOS transistor 417 directly provides the current to node n1 through its source. More specifically, NMOS transistor 417 has its drain connected to Vdd and its source connected to n1. The potential to the gate of NMOS transistor 417 controls the flow of current to node n1. That potential is controlled by a PMOS transistor 421, an NMOS transistor 418 and a resistor 423.

These three components are connected in series between Vdd and ground. Specifically, resistor 423 is coupled to ground. It is also coupled to the source of NMOS transistor 418. The connection between transistor 418 and resistor 423 is a node n4. The drain of NMOS transistor 418 is coupled to the drain of PMOS transistor 421, and the source of PMOS transistor 421 is connected to Vdd. A node n5 is provided between the drain of transistor 418 and the source of transistor 421. That node is connected directly to a line 425 which controls the potential to the gates of NMOS transistors 417 and 418. The gate of PMOS transistor 421 is controlled by the potential on node n8—which as mentioned above is controlled by current source 411 in conjunction with PMOS transistor 413.

In the specific embodiment shown, resistor 423 is made from polysilicon which has a resistance having a positive temperature coefficient. Thus, as the temperature increases, the resistance of resistor 423 also increases, thereby increasing the potential drop across it. This in turn raises the potential at node n5 which increases the current flow through transistor 417 to node n1.

In a specific embodiment, both NMOS transistor 417 and NMOS transistor 418 have a channel width of 10 microns and a channel length of 0.4 microns. In this embodiment, PMOS transistor 421 has a channel width of two microns and a channel length of 1 micron. Further in this embodiment, resistor 423 has a room temperature resistance of 67.2 Kohms. Preferably, it is fabricated from 16 polysilicon strips, each of 4.2 Kohms resistance.

The dynamic response of the node 405 in a schematic of FIG. 4 is susceptible to undershoots due to large currents as explained above. In order to prevent such undershoots, the voltage at n1 may be tracked. When transistor 401 conducts a large current, the voltage at node n1 increases. When the current at transistor 401 then rapidly decreases (e.g., when a write operation is complete), the voltage on node n1 lags and causes the above-described undershoot. To prevent the undershoot, a current mirror circuit coupled to node n1 may supply additional current when necessary to increase the reference voltage value on NMOS transistor 403. This has the effect of detecting and mitigating the undershoot of Vlb.

In the schematic shown in FIG. 4, node 1 is coupled to the gate of an NMOS transistor 427 which has a source connected to ground. The drain of transistor 427 is connected to the current mirror which includes a PMOS transistor 429 and a second PMOS transistor 431 having their gates coupled to one another. The drain of NMOS transistor 427 is connected to the drain of PMOS transistor 429, whose source is connected to Vdd. A node n6 between the drain of transistor 427 and the drain of transistor 429 is connected to a line 433 which is connected to the gates of both transistors 429 and 431. Transistor 431 is connected between Vdd and a node n3.

The potential at node n3 is the potential on line 407 and hence on the gate of NMOS transistor 403. Node n3 is located between two transistors connected in series, a PMOS transistor 435 connected to Vdd and an NMOS transistor 437 connected to ground through a resistor 439. The gate of PMOS transistor 435 is connected to node n8 (which is also connected to the gate of PMOS transistor 413 and line 415). The gate of NMOS transistor 437 is connected to line 407 which is held at the potential of node n3.

In a specific implementation, NMOS transistor 427 has a channel width of 7.5 microns and in a channel length of 3.5 microns. In this embodiment, the PMOS transistors 429 and 431 each have a channel width of 5 microns in a channel length of 1 micron. The same is true of transistor 435. Further in this embodiment, NMOS transistor 437 has a channel width of 11 microns and a channel length of 0.4 microns. Still further, resistor 439 is designed with a resistance of 16.8 Kohms (preferably implemented as 4 strips of polysilicon each of 4.2 Kohms resistance).

In operation, as the potential at n1 increases, (due to increased current through Vlb for example), the gate voltage on NMOS transistor 427 increases, thereby increasing the current flow through that transistor. This results in more current flowing into node n3 from transistor 431. This serves to increase the potential at node n3 by an amount that is a function of the voltage at n1. Then, if the current through Vlb is abruptly shut off, the potential at node n1 remains high temporarily thereby keeping the potential at node n3 high as well. This allows additional current to flow through NMOS transistor 403 of the cascode, and prevents undershoot.

As indicated, the Vlb generator shown in FIG. 4 may be correlated to the generator shown in high level in FIGS. 1–3. Referring to FIGS. 1–4, current source 20 (providing a current of Ibias) is implemented in the FIG. 4 schematic via PMOS transistor 409 and associated control circuitry which includes current source 411, PMOS transistor 413, and node n8. Current source 30 (providing a current of Ibias 1) provides current to node n1. It is represented in the schematic of FIG. 4 as NMOS transistor 417 and associated circuitry including NMOS transistor 418, PMOS transistor 421, and resistor 423.

Further, current source 32 (providing a current of Ibias 2) is represented in the schematic of FIG. 4 as a current mirror including PMOS transistors 429 and 431. The leg of the current mirror including transistor 429 also includes NMOS transistor 427. The leg of the current mirror including PMOS transistor 431 ties into the current path including PMOS transistor 435, NMOS transistor 437 and resistor 439. Of course, current source 32 would also include line 407 to the gate of transistor 403.

In FIG. 4 implementation, current source 411 in conjunction with PMOS transistor 413 essentially sets the bias for the current supplies for a number of legs of the circuitry. It does this through node n8. The potential in node n8 directly controls transistor 409, transistor 421, and transistor 435, each of which are current sources.

Figure 5:
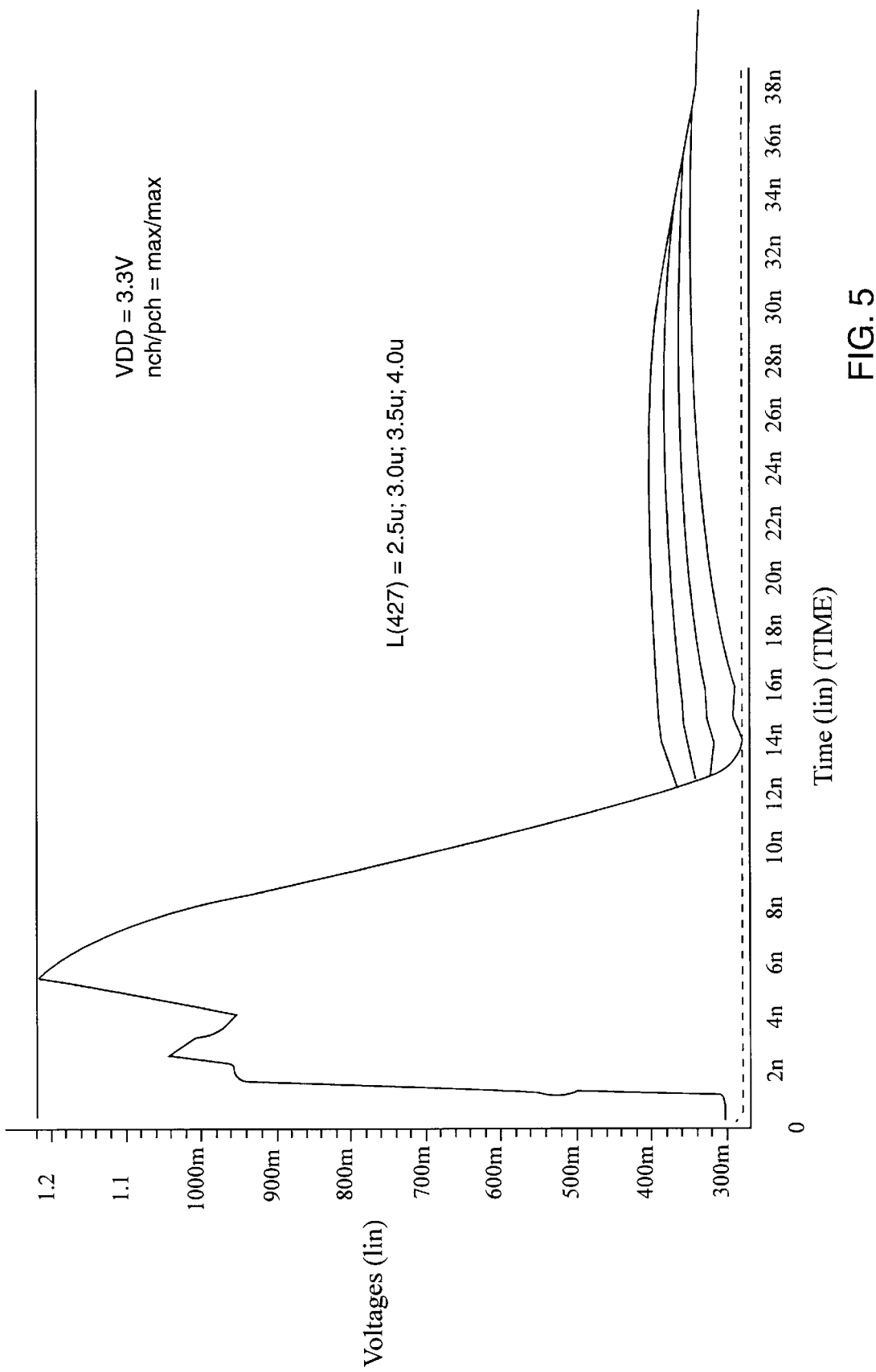
FIG. 5 graphically illustrates that undershoot is avoided in the circuit of FIG. 4. The Figure presents a family of simulated regulation curves for the cascode circuit's output voltage to the bitline as a function of cascode transistor width.

FIG. 5 illustrates a family of regulation curves for Vlb as a function of channel length for NMOS transistor 427, which determines the upward shift in reference current and hence the upward shift in the voltage at node n1 in the dynamic mode of operation. The largest channel length is 4.0 microns and its performance is represented by the lowest curve. Gradually decreasing the channel length gradually increases the curve height. In this case, the curve corresponding to a 2.5 micron channel length represents the highest curve. Thus, the size of transistor 427 can be used to fine tune the Vlb regulation curve. The transient characteristic shown in FIG. 5 is undershoot free. The overshoot shown in these figures may be limited with the aid of a clamping diode (e.g., an NMOS transistor 452 in diode configuration), connected to the output of the Vlb generator shown in FIG. 4.

Although the foregoing invention has been described in some detail for purposes of clarity of understanding, it will be apparent that certain changes and modifications may be practiced within the scope of the appended claims. For example, while the specification has described certain embodiments which accomplish the objectives of the present invention, many others which will be understood by those of skill in the art from the present disclosure to be within the spirit of the present invention may also be used. For example, while the specification has exemplified a specific circuitry to carry out the desired current source functions, other circuitry implementing the same or similar a functions may also be employed. Therefore, the present embodiments are to be considered as illustrative and not restrictive, and the invention is not to be limited to the details given herein, but may be modified within the scope of the appended claims.

What is claimed is:

1. A memory system for clamping a bitline voltage above zero volts, the memory system comprising:

a memory array including a bitline;

a sense amplifier; and a cascode circuit comprising two transistors of a first polarity, the cascode circuit having an output which controls the potential of the bitline, whereby the sense amplifier is interposed between the memory array and the output of the cascode circuit.

2. The memory system of claim 1, further comprising one or more pass transistors interposed between the bitline and the cascode circuit output.

3. The memory system of claim 1, wherein the cascode circuit is implemented in MOS transistors.

4. The memory system of claim 1, wherein the memory array is a DRAM array.

5. The memory system of claim 1, wherein the cascode circuit comprises a first transistor and a second transistor connected in series between Vdd and ground, and wherein the cascode output is located between the first and second transistors, and wherein the first transistor is located between ground and the second transistor.

6. The generator of claim 5, wherein the cascode circuit further comprises a first current source coupled in series between Vdd and the second transistor.

7. The generator of claim 6, wherein the cascode circuit further comprises a second current source connected to a first node located between said second transistor and the current source, which second current source provides current as a function of the difference between a reference voltage and the voltage at the first node.

8. The generator of claim 7, wherein the cascode circuit further comprises a third current source connected to a gate of the second transistor, which third current source provides current as a function of the voltage at the first node.

9. The generator of claim 5, wherein the cascode circuit further comprises an additional current source connected to a gate of the second transistor, which additional current source provides current as a function of the voltage at a first node located between said second transistor and the current source.

10. The memory system of claim 1, wherein the memory array is embedded in a non-memory integrated circuit.

11. A low voltage generator comprising:

a cascode circuit having a first transistor connected to ground, a second transistor connected in series to the first transistor, a first current source connected in series between the second transistor and Vdd, and a first node between said second transistor and the current source, which first node is directly connected to a gate of the first transistor;

a second current source connected to the first node, which second current source provides current as a function of the difference between a reference voltage and the voltage at the first node; and a cascode output node between the first and second transistors, which output node is coupled to a sense amplifier and thereby controls the potential on a bitline.

12. The low voltage generator of claim 11, further comprising control circuitry coupled to the second current source, which control circuitry provides the reference voltage.

13. The low voltage generator of claim 12, wherein the reference voltage is a function of the resistance of a temperature sensitive resistor.

14. The low voltage generator of claim 11, wherein the first and second transistors are NMOS transistors.

15. The low voltage generator of claim 11, wherein the cascode output node is coupled to the bitline through one or more pass transistors.

16. The low voltage generator of claim 11, wherein the bitline accesses a DRAM array.

17. A low voltage generator comprising:

a cascode circuit having a first transistor connected to ground, a second transistor connected in series to the first transistor, a first current source connected in series between the second transistor and Vdd, and a first node between said second transistor and the current source, which first node is directly connected to a gate of the first transistor;

an additional current source connected to a gate of the second transistor, which additional current source provides current as a function of the voltage at the first node; and a cascode output node between the first and second transistors, which output node is coupled to a sense amplifier and thereby controls the potential on a bitline.

18. The low voltage generator of claim 17, further comprising a current mirror coupled between the first node and the additional current generator.

19. The low voltage generator of claim 17, wherein the first and second transistors are NMOS transistors.

20. The low voltage generator of claim 17, wherein the cascode output node is coupled to the bitline through one or more pass transistors.

21. The low voltage generator of claim 17, wherein the bitline accesses a DRAM array.

22. The low voltage generator of claim 17, further comprising a diode connected to the cascode output node to thereby limit overshoot at said cascode output node.

* * * * *